(12) United States Patent
Sung et al.

(10) Patent No.: US 12,075,645 B2
(45) Date of Patent: Aug. 27, 2024

(54) DISPLAY DEVICE

(71) Applicant: Samsung Display Co., Ltd., Yongin-si (KR)

(72) Inventors: Wooyong Sung, Yongin-si (KR); Sooyoun Kim, Yongin-si (KR); Seunghun Kim, Yongin-si (KR); Junghan Seo, Yongin-si (KR); Hyoungsub Lee, Yongin-si (KR); Moonwon Chang, Yongin-si (KR); Seunggun Chae, Yongin-si (KR); Wonwoo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 849 days.

(21) Appl. No.: 17/050,817

(22) PCT Filed: Nov. 21, 2018

(86) PCT No.: PCT/KR2018/014378
§ 371 (c)(1),
(2) Date: Oct. 26, 2020

(87) PCT Pub. No.: WO2020/004730
PCT Pub. Date: Jan. 2, 2020

(65) Prior Publication Data
US 2021/0234125 A1    Jul. 29, 2021

(30) Foreign Application Priority Data

Jun. 28, 2018   (KR) ........................ 10-2018-0074971

(51) Int. Cl.
*H10K 50/844*   (2023.01)
*H10K 59/122*   (2023.01)
(Continued)

(52) U.S. Cl.
CPC ......... *H10K 50/844* (2023.02); *H10K 59/122* (2023.02); *H10K 59/124* (2023.02); *H10K 59/131* (2023.02)

(58) Field of Classification Search
CPC .... H10K 59/131; H10K 59/122; H10K 50/84; G09G 3/20; G09G 3/3225; H01L 21/28
See application file for complete search history.

(56) References Cited

U.S. PATENT DOCUMENTS 9,379,355 B1   6/2016   Lee
9,825,103 B2   11/2017  Rappoport et al.
(Continued)

FOREIGN PATENT DOCUMENTS

CN    107565041 A    1/2018
JP    2018-87863 A   6/2018
(Continued)

OTHER PUBLICATIONS

International Search Report for corresponding International Application No. PCT/KR2018/014378, dated Mar. 27, 2019, 5pp.

*Primary Examiner* — Brian Turner
(74) *Attorney, Agent, or Firm* — Lewis Roca Rothgerber Christie LLP

(57) ABSTRACT

A display device includes: a substrate defining an opening and including a display area and a non-display area between the opening and display area, a pixel array including a plurality of pixels in the display area, each of the pixels having a pixel electrode, an opposite electrode facing the pixel electrode, and an intermediate layer between the pixel electrode and opposite electrode, a plurality of data lines bypassing the opening in the non-display area, first and second insulating layers, which cover the plurality of data lines, a conductive layer between the first and second insulating layers, and a thin film encapsulation layer covering the pixel array, the thin film encapsulation layer includ- (Continued)

ing at least one organic encapsulation layer and at least one inorganic encapsulation layer, and wherein, in the non-display area, a first groove is defined by the first insulating layer, the conductive layer, and the second insulating layer.

20 Claims, 14 Drawing Sheets

(51) Int. Cl.
*H10K 59/124* (2023.01)
*H10K 59/131* (2023.01)

(56) References Cited

U.S. PATENT DOCUMENTS

| | | | |
|---|---|---|---|
| 10,108,149 | B2 | 10/2018 | Kang et al. |
| 10,134,826 | B2 | 11/2018 | Ka et al. |
| 10,193,102 | B2 | 1/2019 | Kanaya |
| 10,199,448 | B2 | 2/2019 | Kim et al. |
| 10,304,913 | B2 | 5/2019 | Choi et al. |
| 10,332,947 | B2 | 6/2019 | Kim et al. |
| 10,418,434 | B2 | 9/2019 | Kim et al. |
| 10,609,826 | B2 | 3/2020 | Choi et al. |
| 2015/0076476 | A1* | 3/2015 | Odaka .................. H10K 59/122 438/33 |
| 2015/0263308 | A1* | 9/2015 | Park ..................... H10K 59/131 438/34 |
| 2017/0031323 | A1* | 2/2017 | Kim ................... H10K 59/1213 |
| 2017/0148856 | A1 | 5/2017 | Choi et al. |
| 2017/0162637 | A1* | 6/2017 | Choi ........................ G09G 3/20 |
| 2017/0222301 | A1 | 8/2017 | Shiu et al. |
| 2018/0006264 | A1 | 1/2018 | Lee et al. |
| 2018/0014781 | A1 | 1/2018 | Clavelle et al. |
| 2018/0023984 | A1 | 1/2018 | Yang |
| 2018/0026152 | A1 | 1/2018 | Benson et al. |
| 2018/0052540 | A1 | 2/2018 | Myers et al. |
| 2018/0061927 | A1 | 3/2018 | Jeong et al. |
| 2018/0108863 | A1* | 4/2018 | Kajiyama ............. G09G 3/3233 |
| 2018/0321563 | A1* | 11/2018 | Nakamura ........ G02F 1/136227 |

FOREIGN PATENT DOCUMENTS

| | | |
|---|---|---|
| KR | 10-2016-0147116 A | 12/2016 |
| KR | 10-2017-0059527 A | 5/2017 |
| KR | 10-2017-0066767 | 6/2017 |
| KR | 10-2017-0095938 A | 8/2017 |
| KR | 10-2017-0114026 A | 10/2017 |
| KR | 10-2017-0117291 A | 10/2017 |
| KR | 10-2017-0128742 A | 11/2017 |
| KR | 10-2018-0002126 A | 1/2018 |
| KR | 10-2018-0025058 A | 3/2018 |
| KR | 10-2018-0026599 A | 3/2018 |
| KR | 10-2018-0049296 A | 5/2018 |

* cited by examiner

DISPLAY DEVICE

CROSS-REFERENCE TO RELATED APPLICATIONS

This application is a National Phase Patent Application of International Patent Application Number PCT/KR2018/014378, filed on Nov. 21, 2018, which claims priority of Korean Patent Application No. 10-2018-0074971, filed Jun. 28, 2018. The entire contents of both of which are incorporated by reference herein.

TECHNICAL FIELD

The present disclosure relates to a display device.

BACKGROUND ART

Recently, display devices have been used in various fields. Also, as display devices have become thinner and more lightweight, their range of use has gradually been extended.

As an area occupied by a display area of a display device increases, the number of functions that may be combined or associated with the display device has increased. As a way of adding various functions to a display device while increasing the display area, research has been conducted on display devices having an opening formed in a display area.

DESCRIPTION OF EMBODIMENTS

Technical Problem

In forming a display device having an opening, an encapsulation member may move up from a structure thereunder as a bonding force between the encapsulation member and the structure weakens.

The present disclosure is to solve a number of problems including the above problem, and provides a display device in which an encapsulation member is prevented from moving up. However, this objective is just an example, and the scope of the present disclosure is not limited thereby.

Solution to Problem

According to an aspect of the present disclosure, a display device includes a substrate defining an opening, and including a display area and a non-display area between the opening and the display area, a pixel array including a plurality of pixels in the display area, each of the plurality of pixels having a pixel electrode, an opposite electrode facing the pixel electrode, and an intermediate layer between the pixel electrode and the opposite electrode, a plurality of data lines bypassing the opening in the non-display area, a first insulating layer and a second insulating layer, which cover the plurality of data lines, a conductive layer between the first insulating layer and the second insulating layer, and a thin film encapsulation layer covering the pixel array, the thin film encapsulation layer including at least one organic encapsulation layer and at least one inorganic encapsulation layer, wherein, in the non-display area, a first groove is defined by the first insulating layer, the conductive layer, and the second insulating layer.

The first groove may overlap the plurality of data lines.

The width of the first groove at the conductive layer may be less than the width of the first groove at the first insulating layer.

At least one of the intermediate layer or the opposite electrode may extend toward the opening and may be disconnected around the first groove of the conductive layer.

A portion of the at least one organic encapsulation layer may be in the first groove.

The at least one inorganic encapsulation layer may entirely cover an inner surface of the first groove.

The first groove may surround the opening.

The display device may further include a multi-insulating layer on the substrate and under the first insulating layer, and a second groove may be defined by the multi-insulating layer and the substrate.

The second groove may be between the opening and the first groove, and surround the opening.

The at least one organic encapsulation layer may extend toward the opening and may be disconnected around the second groove.

The second insulating layer may cover an edge of the pixel electrode.

According to another aspect of the present disclosure, a display device includes: a substrate defining an opening, a pixel array including a plurality of pixels on the substrate and surrounding the opening, each of the plurality of pixels including a display element including a pixel electrode, an intermediate layer on the pixel electrode, and an opposite electrode on the intermediate layer, a plurality of data lines between the opening and the pixel array, the plurality of data lines bypassing the opening along an edge of the opening, and a multi-layer on the plurality of data lines, the multi-layer defining a first groove.

At least one of the intermediate layer or the opposite electrode may be disconnected around the first groove.

The multi-layer may include a first layer defining a first open area, a second layer under the first layer, the second layer defining a second open area, and a third layer on the first layer, the third layer defining a third open area, wherein a width of the first open area may be less than a width of the second open area.

The first layer may include the same material as the pixel electrode, and the second layer and the third layer may include an insulating material.

The display device may further include a thin film encapsulation layer covering the pixel array, the thin film encapsulation layer including at least one organic encapsulation layer and at least one inorganic encapsulation layer.

A portion of the at least one organic encapsulation layer may be in the first groove.

The at least one organic encapsulation layer may extend toward the opening and may be disconnected in an area between the opening and the first groove.

The display device may further include a multi-insulating layer between the substrate and the multi-layer, and where a second groove may be defined by the multi-insulating layer and the substrate.

The second groove may be between the opening and the first groove, and may surround the opening.

Other aspects, and features other than those described above will become apparent from the following drawings, claims, and detailed description of the disclosure.

Advantageous Effects of Disclosure

According to embodiments of the present disclosure, it is possible to effectively prevent lifting of a thin film encapsulation layer around an opening, for example, a phenomenon wherein lifting of the thin film encapsulation layer occurs with respect to data lines bypassing the opening, and thus prevent damage to pixels around the opening. However, these effects are exemplary, and the scope of the present disclosure is not limited thereby.

BRIEF DESCRIPTION OF DRAWINGS

FIG. 12 is a plan view illustrating an organic encapsulation layer around an opening in a display device according to another embodiment of the present disclosure.

MODE OF DISCLOSURE

Figure 1:
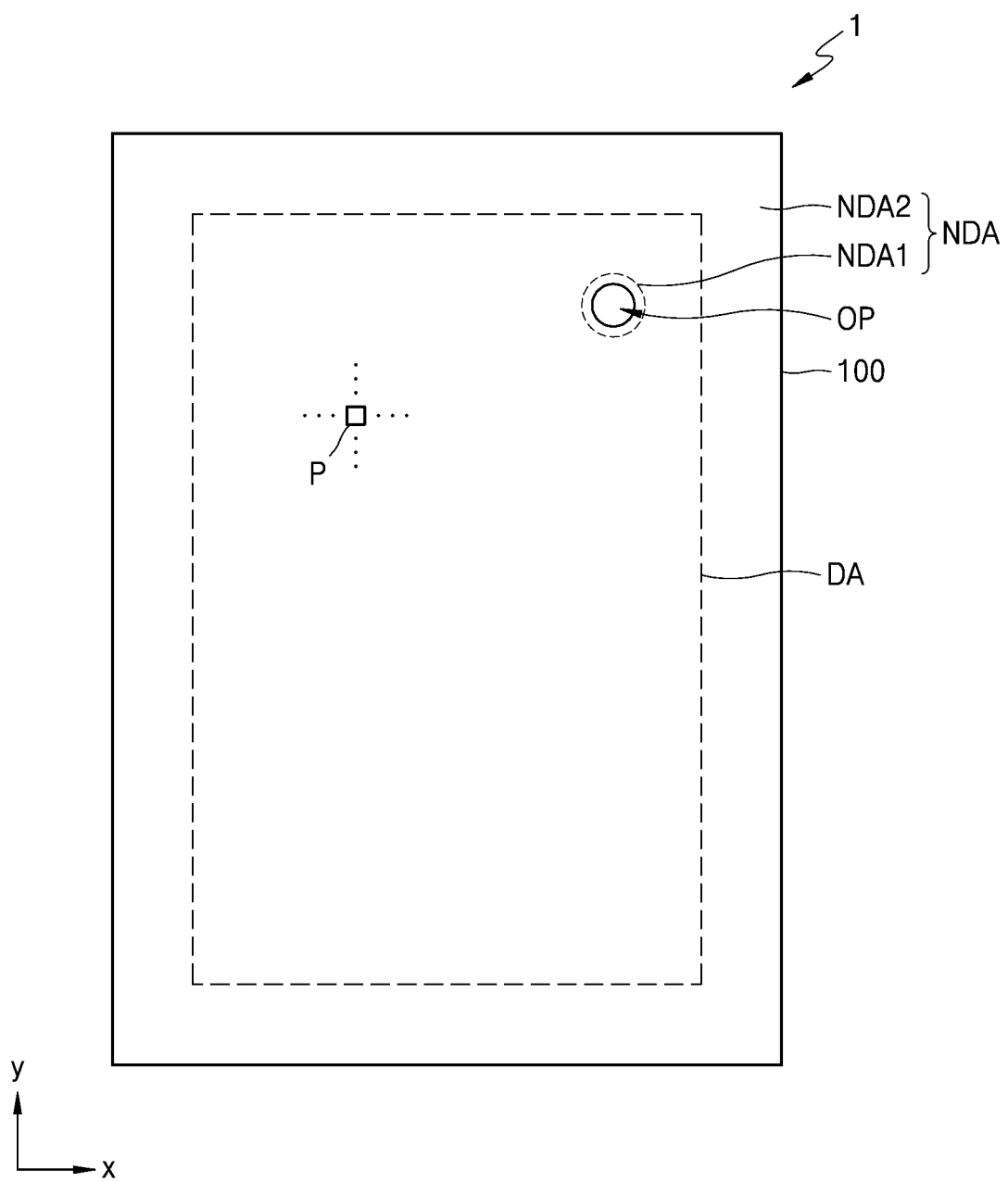
FIG. 1 is a schematic plan view illustrating a display device according to an embodiment of the present disclosure.

Since the present disclosure may have various modifications and several embodiments, embodiments are shown in the drawings and will be described in detail. Effects, features, and a method of achieving the same will be specified with reference to the embodiments described below in detail together with the attached drawings. However, the embodiments may have different forms and should not be construed as being limited to the descriptions set forth herein.

Hereinafter, the present disclosure will be described in detail by explaining the embodiments of the present disclosure with reference to the attached drawings, and like reference numerals in the drawings denote like elements and thus their repeated description may be omitted.

It will be understood that although the terms "first," "second," etc. may be used herein to describe various components, these components should not be limited by these terms and are only used to distinguish one component from another.

As used herein, the singular forms "a," "an" and "the" are intended to include the plural forms as well, unless the context clearly indicates otherwise.

It will be further understood that the terms "includes," "including," "has" and/or "having" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated or reduced for convenience of description. In other words, since sizes and thicknesses of components in the drawings are arbitrarily illustrated for convenience of description, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with another layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

Display devices may include an organic light-emitting display device, an inorganic electroluminescence (EL) display device (or an inorganic light-emitting display device), a quantum dot light-emitting display device, or the like. Hereinafter, as a display device according to an embodiment of the present disclosure, an organic light-emitting display device is described as an example. However, the display device of the present disclosure is not limited thereto, and various types of display devices may be used.

FIG. 1 is a schematic plan view illustrating a display device 1 according to an embodiment of the present disclosure.

Referring to FIG. 1, the display device 1 includes a display area DA and a non-display area NDA. The display area DA is an area that provides a certain image, and includes a pixel array including a plurality of pixels P. Each of the pixels P may include a display element such as an organic light-emitting diode (OLED).

The pixel P may emit red, green, blue, or white light through the organic light-emitting diode. The pixel P in the present disclosure may be understood as a pixel that emits light of any one of red, green, blue, and white, as described above. The display area DA may be covered with an encapsulation member and thus may be protected from external air or moisture.

An opening OP may be provided inside the display area DA. The opening OP may be surrounded by pixels P. The opening OP may be an area for a separate electronic element for the function of the display device 1 or an area for separate electronic elements to add new functions. For example, when the display device 1 includes an electronic element such as a camera, an acoustic element, or a sensor for recognizing a distance, a fingerprint, or the like, the electronic element may be arranged to overlap the opening OP.

The non-display area NDA may include a first non-display area NDA1 adjacent to an inner edge of the display area DA, and a second non-display area NDA2 adjacent to an outer edge of the display area DA. The first non-display area NDA1 and the second non-display area NDA2 may be spaced apart from each other with the display area DA therebetween.

The first non-display area NDA1 is an area that does not provide an image, and may be located between the opening OP and the pixel array of the display area DA. The first non-display area NDA1 may surround the opening OP. The first non-display area NDA1 may be surrounded by the pixel array of the display area DA. In the first non-display area NDA1, wiring lines for providing electrical signals to pixels P adjacent to the opening OP may bypass the opening OP, and the wiring lines may be bent along the edge of the opening OP.

The second non-display area NDA2 is an area that does not provide an image, and a driver (e.g., a scan driver, a data driver, etc.) and a wiring line for transmitting an electrical signal or power that is transmitted to each pixel P may be arranged in the second non-display area NDA2.

FIG. 1 may be understood as a state of a substrate 100 in the display device 1. For example, it may be understood that the substrate 100 has an opening area corresponding to the opening OP, the display area DA, and the first and second non-display areas NDA1 and NDA2. The substrate 100 may include a material such as glass, metal, or organic material. According to an embodiment, the substrate 100 may include a flexible material. For example, the substrate 100 may include a metal material that may bend or roll well, or a material such as an organic polymer resin including polymer such as polyethylen terephthalate (PET), polyethylene naphthalate (PEN), or polyimide.

Figure 2:
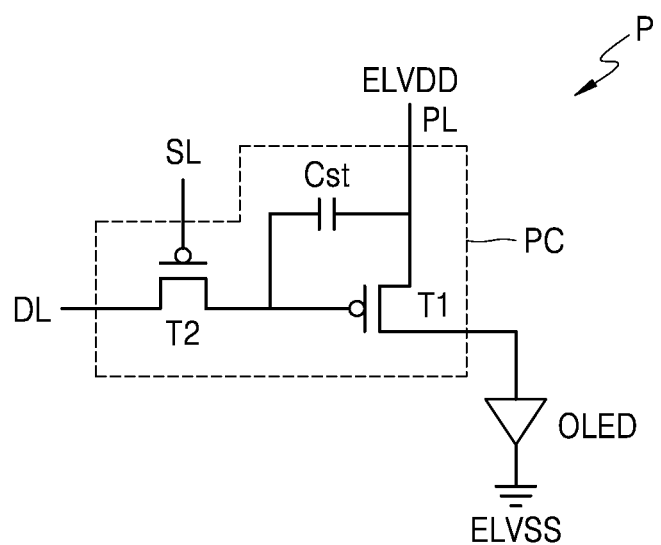
FIG. 2 is a circuit diagram of a pixel of a display device according to an embodiment of the present disclosure.

FIG. 2 is a circuit diagram of the pixel P of a display device according to an embodiment of the present disclosure.

Referring to FIG. 2, the pixel P includes a pixel circuit PC and a display element connected to the pixel circuit PC. In FIG. 2, an organic light-emitting diode OLED is illustrated as the display element PC. The pixel circuit PC may include a first thin film transistor T1, a second thin film transistor T2, and a storage capacitor Cst.

The second thin film transistor T2 is a switching thin film transistor and is connected to a scan line SL and a data line DL, and may be configured to transfer a data voltage input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor and may be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having certain brightness by using the driving current. An opposite electrode (e.g., a cathode) of the organic light-emitting diode OLED may receive a second power voltage ELVSS.

Although it is shown in FIG. 2 that the pixel circuit PC includes two thin film transistors and one storage capacitor, the present disclosure is not limited thereto. The number of thin film transistors and the number of storage capacitors may be variously modified depending on a design of the pixel circuit PC.

Figure 3:
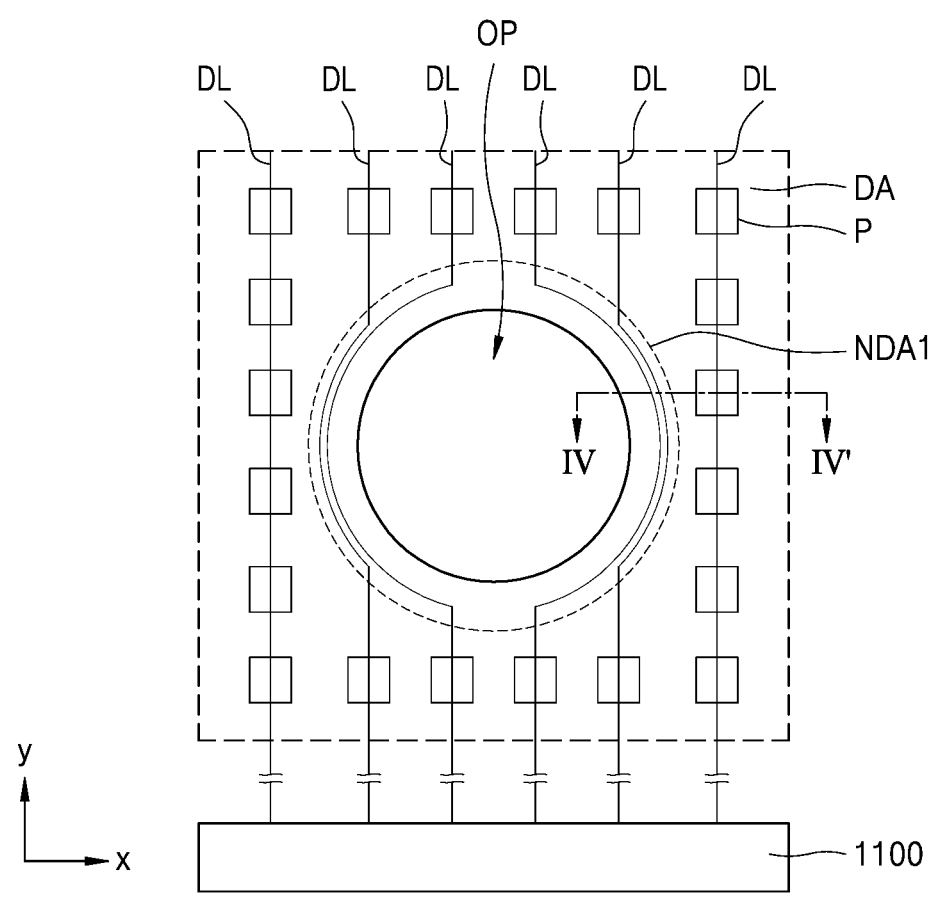
FIG. 3 is a plan view illustrating the periphery of an opening in a display device according to an embodiment of the present disclosure.

FIG. 3 is a plan view illustrating the periphery of an opening in a display device according to an embodiment of the present disclosure.

Referring to FIG. 3, a plurality of pixels P are arranged around an opening OP. Each of the pixels P may include an organic light-emitting diode OLED, as described above with reference to FIG. 2, and the organic light-emitting diode OLED is electrically connected to a scan line, a data line, and the like. FIG. 3 shows data lines DL.

The data lines DL are electrically connected to a data driver 1100. The data driver 1100 may be of a chip on panel (COP) type and arranged in the second non-display area NDA2 (see FIG. 1), or may be of a chip on film (COF) type and arranged on a flexible circuit board (not shown) electrically connected to a terminal provided in the second non-display area NDA2.

Some of the data lines DL located around the opening OP may be bent to bypass the opening OP along the edge of the opening OP in the first non-display area NDA1.

Although not shown in FIG. 3, the scan lines may extend in a direction (e.g., x direction) crossing the data lines DL, and may be bent along the edge of the opening OP in the first non-display area NDA1 like the data lines DL. Alternatively, scan lines may be cut around the opening OP. In this case, each of the scan lines connected to pixels P arranged on the left side of the opening OP and each of the scan lines connected to pixels P arranged on the right side of the opening OP may be individually connected to a scan driver.

Figure 4:
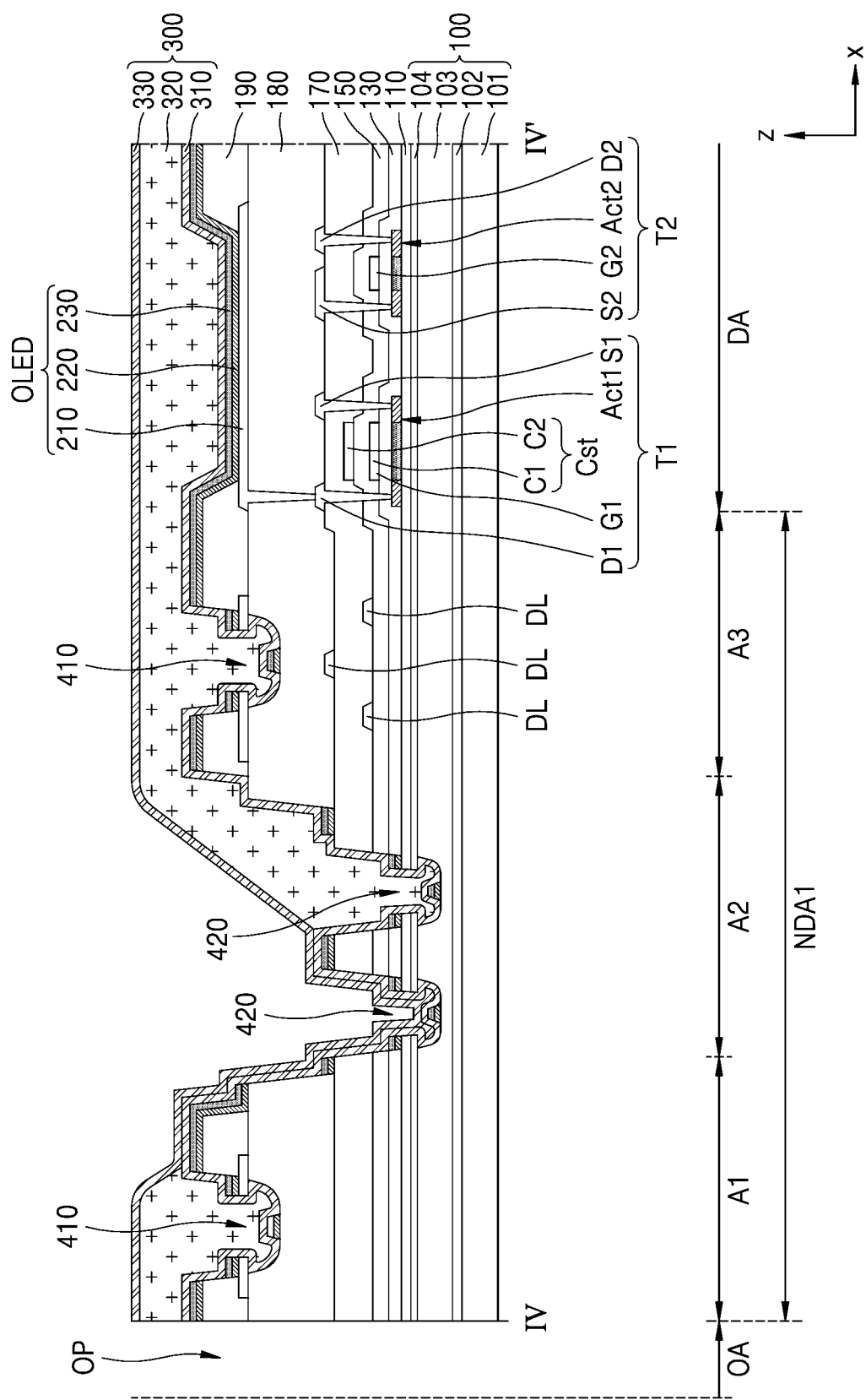
FIG. 4 is a cross-sectional view of a display device according to an embodiment of the present disclosure taken along a line IV-IV' of FIG. 3.
Figure 5A:
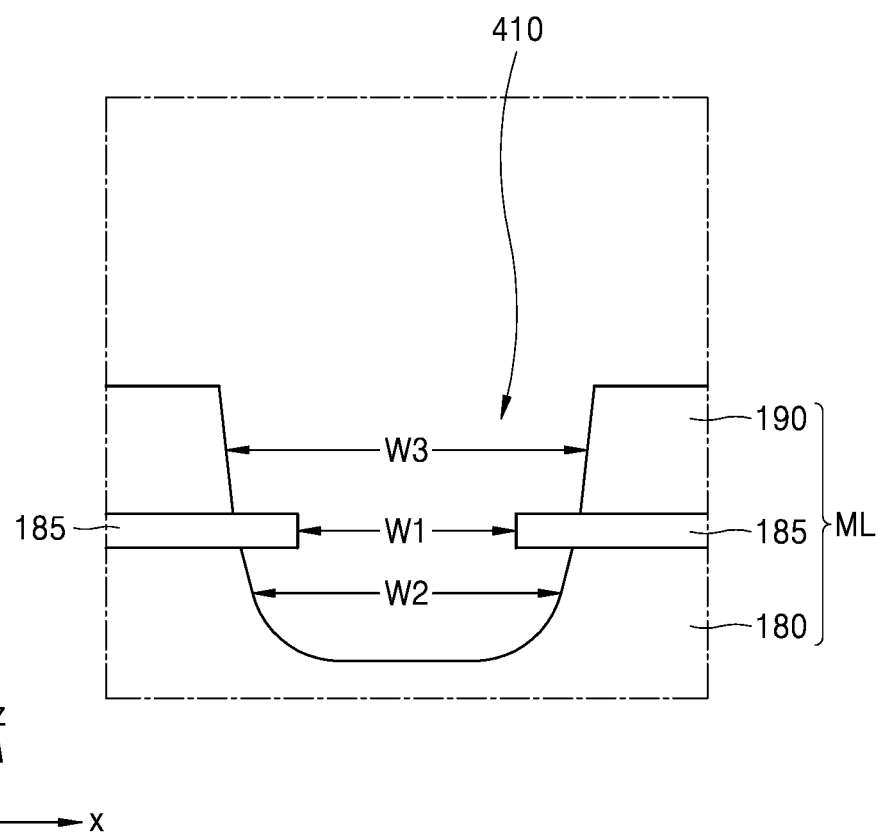
FIG. 5A is a cross-sectional view illustrating a first groove of a display device according to an embodiment of the present disclosure.
Figure 5B:
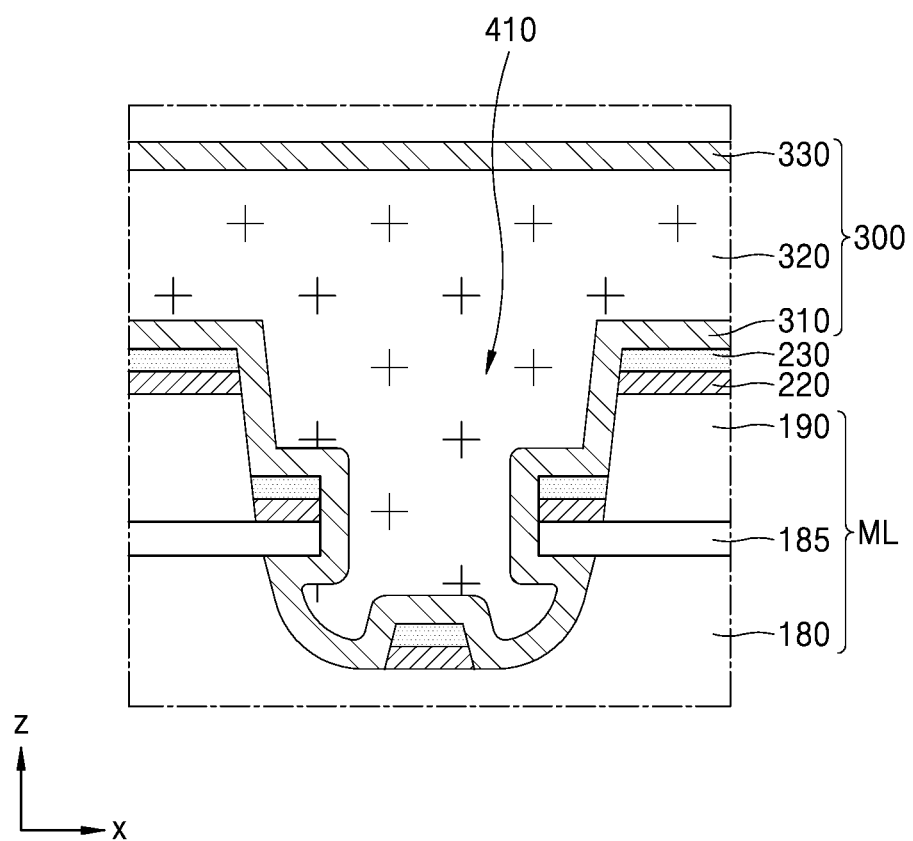
FIG. 5B is a cross-sectional view illustrating the first groove and a stacked structure thereon.
Figure 6A:
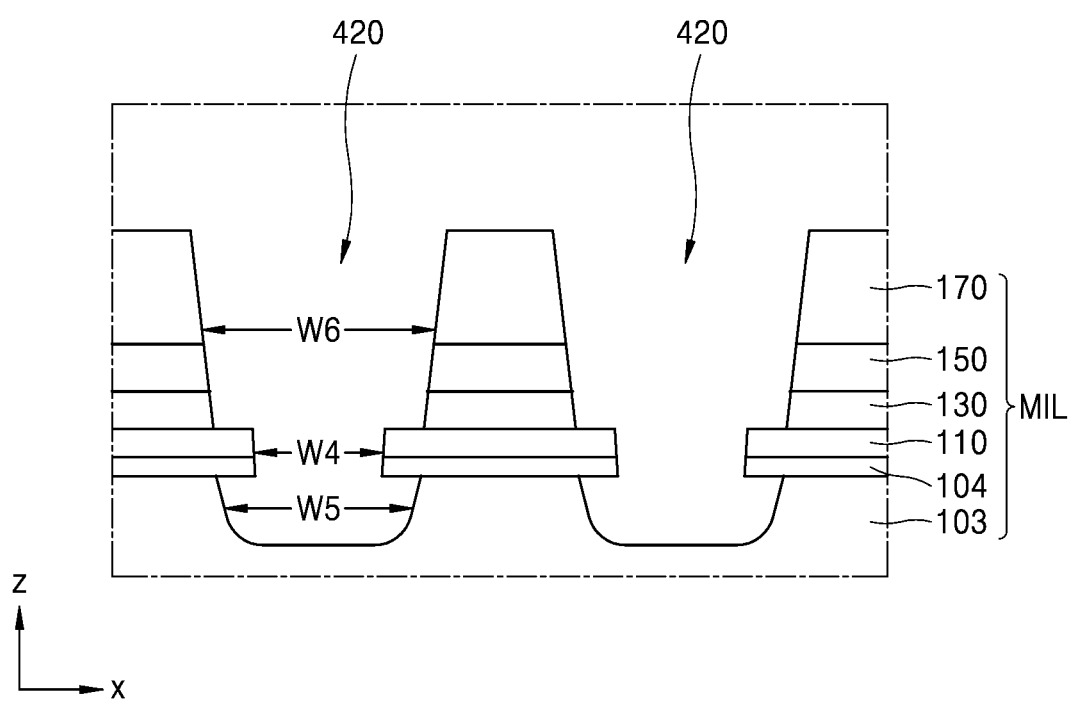
FIG. 6A is a cross-sectional view illustrating a second groove of a display device according to an embodiment of the present disclosure.
Figure 6B:
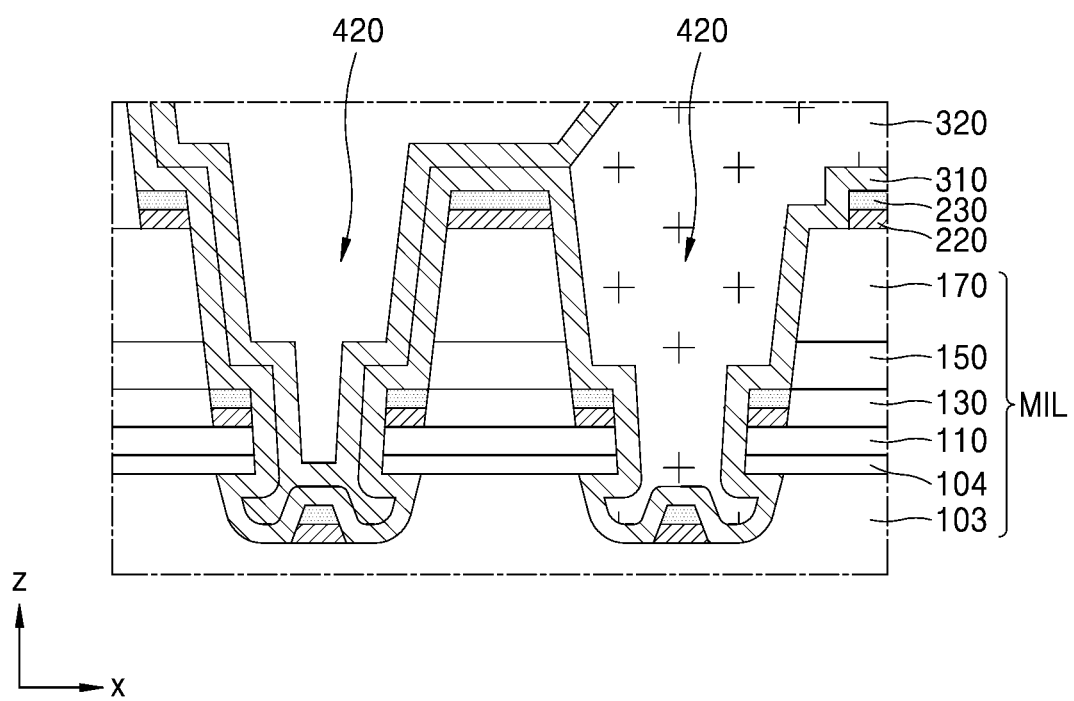
FIG. 6B is a cross-sectional view illustrating the second groove and a stacked structure thereon.
Figure 7:
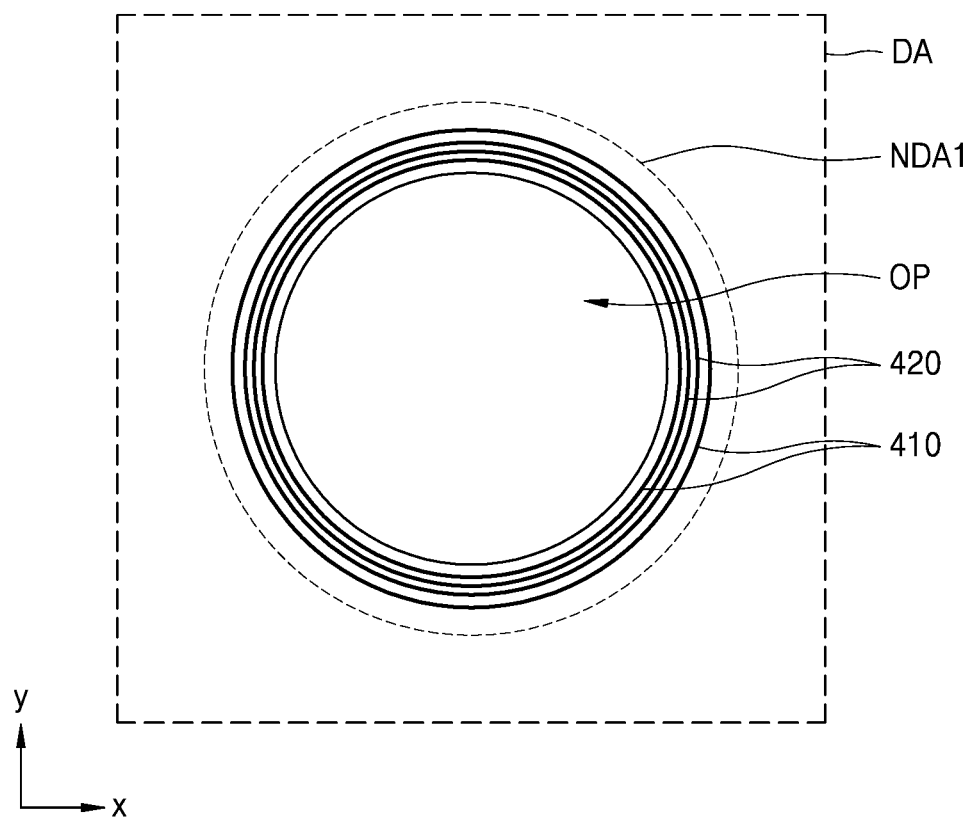
FIG. 7 is a plan view illustrating the first and second grooves around an opening in a display device according to an embodiment of the present disclosure.
Figure 8:
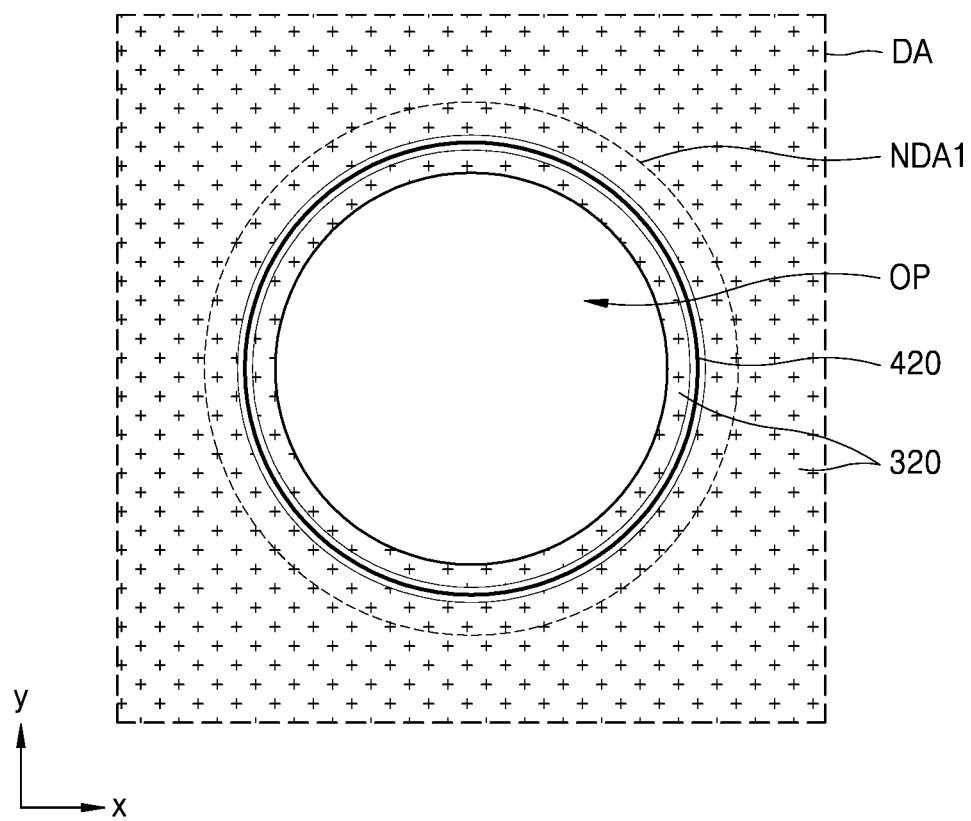
FIG. 8 is a plan view illustrating an organic encapsulation layer around an opening in a display device according to an embodiment of the present disclosure.

FIG. 4 is a cross-sectional view of a display device according to an embodiment of the present disclosure, and corresponds to a cross-sectional view taken along line IV-IV' of FIG. 3. FIG. 5A is a cross-sectional view illustrating a first groove of a display device according to an embodiment of the present disclosure, and FIG. 5B is a cross-sectional view illustrating the first groove and a stacked structure thereon. FIG. 6A is a cross-sectional view illustrating a second groove of a display device according to an embodiment of the present disclosure, and FIG. 6B is a cross-sectional view illustrating the second groove and a stacked structure thereon. FIG. 7 is a plan view illustrating a groove around an opening in a display device according to an embodiment of the present disclosure, and FIG. 8 is a plan view illustrating an organic encapsulation layer around an opening in a display device according to an embodiment of the present disclosure.

Referring to FIG. 4, the substrate 100 includes an opening area OA corresponding to the opening OP, the display area DA in which a display element is arranged, and the first non-display area NDA1 between the opening area OA and the display area DA.

The substrate 100 may have a multi-layer structure including a base layer and a barrier layer. In this regard, FIG. 4 illustrates that the substrate 100 includes a first base layer 101, a first barrier layer 102, a second base layer 103, and a second barrier layer 104, which are sequentially stacked.

The first and second base layers 101 and 103 may each include a polymeric resin, such as polyethersulphone (PES), polyacrylate (PAR), polyetherimide (PEI), polyethylene naphthalate (PEN), polyethylene terephthalide (PET), polyphenylene sulfide (PPS), polyallylate, polyimide (PI), polycarbonate (PC), or cellulose acetate propionate (CAP).

The first and second barrier layers 102 and 104 may each include silicon oxide, silicon nitride, or the like. In a non-limiting embodiment of the present disclosure, the first barrier layer 102 may be a multi-layer including an amorphous silicon layer and a silicon oxide layer to improve adhesion between neighboring layers, and the second barrier layer 104 may be a silicon oxide layer. However, the present disclosure is not limited thereto.

A buffer layer 110 formed to prevent impurities from penetrating into a semiconductor layer of a thin film transistor may be arranged on the substrate 100. The buffer layer 110 may include an inorganic insulating material such as silicon nitride or silicon oxide, and may be a single layer or a multi-layer including the inorganic insulating material described above. In some embodiments, the second barrier layer 104 of the substrate 100 may be understood as a portion of the buffer layer 110 having a multi-layer structure.

First and second thin film transistors T1 and T2, the storage capacitor Cst, and the like may be arranged on the buffer layer 110.

The first thin film transistor T1 may be a driving thin film transistor and may include a semiconductor layer Act1, a gate electrode G1, a source electrode S1, and a drain electrode D1. The second thin film transistor T2 may be a switching thin film transistor and may include a semiconductor layer Act2, a gate electrode G2, a source electrode S2, and a drain electrode D2. The source electrode S2 of the second thin film transistor T2 may be understood as a portion of the data line DL described above with reference to FIG. 2. In the present embodiment, a top gate type in which the gate electrodes G1 and G2 are respectively arranged on the semiconductor layers Act1 and Act2 with a gate insulating layer 130 therebetween is illustrated. However, according to another embodiment, the first and second thin film transistors T1 and T2 may be of a bottom gate type.

The semiconductor layers Act1 and Act2 may each include polysilicon. Alternatively, the semiconductor layers Act1 and Act2 may each include amorphous silicon, an oxide semiconductor, or an organic semiconductor.

The gate electrodes G1 and G2 may each include a low-resistance metal material. For example, the gate electrodes G1 and G2 may each include a conductive material including molybdenum (Mo), aluminum (Al), copper (Cu), titanium (Ti), or the like, and may each include a multi-layer or a single layer including the material.

The gate insulating layer 130 is between the semiconductor layers Act1 and Act2 and the gate electrodes G1 and G2, respectively, and the gate insulating layer 130 may include an inorganic insulating material, such as silicon oxide, silicon nitride, silicon oxynitride, aluminum oxide, titanium oxide, tantalum oxide, or hafnium oxide.

The source electrodes S1 and S2 and the drain electrodes D1 and D2 may each include a material having good conductivity. For example, the source electrodes S1 and S2 and the drain electrodes D1 and D2 may each include a conductive material including Mo, Al, Cu, Ti, or the like, and may each include a multi-layer or a single layer including the material. In a non-limiting embodiment, the source electrodes S1 and S2 and the drain electrodes D1 and D2 may each include a multi-layer of Ti/Al/Ti.

The storage capacitor Cst includes a lower electrode C1 and an upper electrode C2 overlapping each other with a first interlayer insulating layer 150 therebetween. The storage capacitor Cst may overlap the first thin film transistor T1. In this regard, FIG. 4 illustrates that the gate electrode G1 of the first thin film transistor T1 is the lower electrode C1 of the storage capacitor Cst and the storage capacitor Cst is covered by a second interlayer insulating layer 170. However, the present disclosure is not limited thereto. In another embodiment, the storage capacitor Cst may not overlap the first thin film transistor T1.

The first and second interlayer insulating layers 150 and 170 may each include an inorganic insulating material, such as silicon oxide, silicon nitride, silicon oxynitride, aluminum oxide, titanium oxide, tantalum oxide, or hafnium oxide.

A pixel circuit including the first and second thin film transistors T1 and T2 and the storage capacitor Cst is covered by the first insulating layer 180. The first insulating layer 180 is a planarization insulating layer and may include an organic insulating material, such as a general-purpose polymer (e.g., polymethylmethacrylate (PMMA) or polystyrene (PS)), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or a blend thereof.

An organic light-emitting diode OLED is arranged on the first insulating layer 180. A pixel electrode 210 of the organic light-emitting diode OLED is disposed on the first insulating layer 180, but the edge of the pixel electrode 210 is covered by a second insulating layer 190, which is a pixel-defining layer. The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or a compound thereof. In another embodiment, the pixel electrode 210 may further include a layer including ITO, IZO, ZnO, or $In_2O_3$ above or below the above-described reflective layer.

The second insulating layer 190 includes an opening exposing the top surface of the pixel electrode 210, but covers the edge of the pixel electrode 210. The second insulating layer 190 may include an organic insulating material, such as a general-purpose polymer (e.g., PMMA or PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or a blend thereof. As an embodiment, the first and second insulating layers 180 and 190 may each include polyimide. Alternatively, the second insulating layer 190 may include an inorganic insulating material, or both an inorganic insulating material and an organic insulating material.

An intermediate layer 220 includes an emission layer. The emission layer may include a high molecular weight or low molecular weight organic material that emits light of a certain color. The intermediate layer 220 may include at least one functional layer, that is, at least one of a hole transport layer (HTL), a hole injection layer (HIL), an electron transport layer (ETL), or an electron injection layer (EIL).

Some of the plurality of layers constituting the intermediate layer 220, for example, the functional layer(s), may be arranged not only in the display area DA but also in the first non-display area NDA1, and may disconnected in the first non-display area NDA1 by first and second grooves 410 and 420 to be described later.

An opposite electrode 230 is arranged to face the pixel electrode 210 with the intermediate layer 220 therebetween. The opposite electrode 230 may include a conductive material having a low work function. For example, the opposite electrode 230 may include a (semi)transparent layer including Ag, Mg, Al, Pt, Pd, Au, Ni, Nd, Ir, Cr, lithium (Li), calcium (Ca), or an alloy thereof. Alternatively, the opposite electrode 230 may further include a layer including ITO, IZO, ZnO, or $In_2O_3$ on the (semi) transparent layer including the aforementioned material.

The organic light-emitting diode OLED is covered with a thin film encapsulation layer 300. The thin film encapsulation layer 300 may include at least one organic encapsulation layer and at least one inorganic encapsulation layer. FIG. 4 illustrates that the thin film encapsulation layer 300 includes first and second inorganic encapsulation layers 310 and 330 and an organic encapsulation layer 320 therebetween, but the stacking order and number of layers may be changed.

The first and second inorganic encapsulation layers 310 and 330 may each include one or more inorganic insulating materials selected from aluminum oxide, titanium oxide, tantalum oxide, hafnium oxide, zinc oxide, silicon oxide, silicon nitride, and silicon oxynitride and may be formed by chemical vapor deposition (CVD). The organic encapsulation layer 320 may include a polymer-based material. Examples of the polymer-based material may include acryl-based resin, epoxy-based resin, polyimide, and polyethylene.

Referring to FIG. 4, the first non-display area NDA1 may include first to third areas A1, A2, and A3.

The first area A1 is an area for securing a cutting margin in a process of removing the substrate 100 and a stacked structure thereon, which correspond to the opening area OA, in order to form the opening OP, and the second area A2 is an area having a valley structure to prevent side moisture permeation. The second groove 420 may be located in the second area A2. The second groove 420 may be defined in the substrate 100 and a multi-insulating layer on the substrate 100. FIG. 4 illustrates that two second grooves 420 are formed, and illustrates that the organic encapsulation layer 320 is disconnected around one of the two second grooves 420. Among layers formed on the substrate 100, a layer including an organic material may be a penetration path for foreign matter such as moisture or oxygen, but may prevent moisture penetration in a lateral direction (i.e., x direction) because the organic encapsulation layer 320 is disconnected in the second region A2.

The third area A3 is an area in which data lines DL that bypass along the edge of the opening OP are arranged around the opening OP. The data lines DL located in the third area A3 may be alternately arranged with an insulating layer therebetween. For example, adjacent data lines DL may be respectively arranged below and above with an insulating layer (e.g., the second interlayer insulating layer 170) therebetween, thereby reducing the distance (pitch) between the adjacent data lines DL. Through this structure, the width of the third area A3 may be reduced, and the width of the first non-display area NDA1 may also be reduced.

In a process of manufacturing a display device having the opening OP, a process of removing the substrate 100 and the stacked structure thereon, which correspond to the opening area OA, is performed as described above. In this case, the removing process may be performed using laser. As an impact is transmitted due to the removing process for forming the opening OP, lifting of the thin film encapsulation layer 300 may occur, and the lifting phenomenon of the thin film encapsulation layer 300 is likely to occur in the third area A3 where a bonding force with the thin film encapsulation layer 300 is relatively weak. However, according to an embodiment of the present disclosure, because the first groove 410 is located in the third area A3, a bonding force between the thin film encapsulation layer 300 and a structure thereunder may be enhanced to thereby prevent or reduce the lifting phenomenon of the thin film encapsulation layer 300. The first groove 410 is located on the data lines DL. The first groove 410 may overlap the data lines DL.

Referring to FIG. 5A, the first groove 410 is defined in a multi-layer ML. The multi-layer ML may cover the data lines DL of the third area A3 described above with reference to FIG. 4 and may include the first insulating layer 180, a conductive layer 185, and the second insulating layer 190, which are sequentially stacked. The conductive layer 185 may include the same material as the pixel electrode 210 described with reference to FIG. 4.

The first groove 410 may be formed to have a certain depth along a depth direction of the multi-layer ML. The first groove 410 may be formed by removing portions of the second insulating layer 190, the conductive layer 185, and the first insulating layer 180. The first groove 410, which is formed while portions of the second insulating layer 190, the conductive layer 185, and the first insulating layer 180 are opened, may have a different width depending on the location thereof.

A first width W1 of an open area (opening) of the conductive layer 185 is less than a second width W2 of an open area (opening) of the first insulating layer 180 below the conductive layer 185. A third width W3 of an open area of the second insulating layer 190 may be greater than the first width W1. In other words, an inner edge of the conductive layer 185 may extend further toward the central axis of the first groove 410 than inner edges of the first and second insulating layers 180 and 190. The first groove 410 may be formed using a laser or through an etching (dry/wet) process.

In FIG. 5A, the open areas of the second insulating layer 190 and the conductive layer 185 may be formed to penetrate the second insulating layer 190 and the conductive layer 185 in a thickness direction thereof, but the open area of the first insulating layer 180 may be formed to be concave with respect to the top surface of the first insulating layer 180. In another embodiment, the open area of the first insulating layer 180 may be formed to penetrate the first insulating layer 180 in a thickness direction thereof, but in this case, the data line DL (see FIG. 4) may be covered with another insulating layer so as not to be exposed through the first groove 410.

When the intermediate layer 220 and the opposite electrode 230 are formed on the substrate 100 having the first groove 410 as shown in FIG. 5A, at least one of the intermediate layer 220 or the opposite electrode 230 may be disconnected around the first groove 410. In this regard, FIG. 5B illustrates that the intermediate layer 220 and the opposite electrode 230 are disconnected by the first groove 410.

The intermediate layer 220 and the opposite electrode 230 may be deposited by an evaporation method using a mask. In this case, the intermediate layer 220 and the opposite electrode 230 are disconnected by an eave structure (undercut structure) formed by the conductive layer 185, which is a layer extending toward the central axis of the first groove 410, and the first insulating layer 180 thereunder. The first groove 410 entirely surrounds the opening OP in the first non-display area NDA1, as shown in FIG. 7. Therefore, the disconnection areas of the intermediate layer 220 and the opposite electrode 230 may also have a ring shape surrounding the opening OP.

Because the first inorganic encapsulation layer 310 has relatively excellent step coverage unlike the intermediate layer 220 and the opposite electrode 230, the first inorganic encapsulation layer 310 may be continuously formed without disconnection to cover the entire inner surface of the first groove 410, as shown in FIG. 5B. For example, the first inorganic encapsulation layer 310 may entirely cover the side surface of the second insulating layer 190, the top surface, side surface, and bottom surface of the conductive layer 185, and the side surface and bottom surface of the first insulating layer 180.

A portion of the organic encapsulation layer 320 may be located in the first groove 410. As at least one of the intermediate layer 220 or the opposite electrode 230 is disconnected by the first groove 410 and the first inorganic encapsulation layer 310 and the organic encapsulation layer 320 fill the inner space of the first groove 410, peeling of the thin film encapsulation layer 300, which may occur in an opening forming process, may be effectively prevented. A bonding force between the thin film encapsulation layer 300 and a structure thereunder, that is, the first groove 410, may be further increased by the shape (anchor shape) of the first groove 410 having a different width depending on the location thereof.

Referring to FIG. 6A, the second groove 420 may also have an anchor shape having a different width depending on the location thereof, similar to the first groove 410.

The second groove 420 is defined in a multi-insulating layer MIL. The multi-insulating layer MIL may include the substrate 100, the buffer layer 110, the gate insulating layer 130, the first interlayer insulating layer 150, and the second interlayer insulating layer 170, which are described above with reference to FIG. 4. FIG. 6A illustrates that the second base layer 103 and the second barrier layer 104 of the substrate 100 are portions of the multi-insulating layer MIL.

The second groove 420 may be formed to have a certain depth in a depth direction of the multi-insulating layer MIL. For example, the second groove 420 may be formed by partially removing the second interlayer insulating layer 170, the first interlayer insulating layer 150, the gate insulating layer 130, the buffer layer 110, the second barrier layer 104, and the second base layer 103.

In an embodiment, a stacked body (hereinafter, referred to as an upper layer) including the second interlayer insulating layer 170, the first interlayer insulating layer 150, and the gate insulating layer 130 may be removed in a process of forming a contact hole for contact between the source electrodes S1 and S2 or drain electrodes D1 and D2 and the semiconductor layers Act1 and Act2 in the display area DA described with reference to FIG. 4. Subsequently, a process of removing a portion of a stacked body (hereinafter, referred to as a middle layer) including the buffer layer 110 and the second barrier layer 104 and a portion of the second base layer 103 (hereinafter, referred to as a lower layer) may be performed. Portions of the middle layer and the lower layer may be removed in a process (laser, etching, etc.) of forming the first groove 410.

A fourth width W4 of an open area of the middle layer is less than a fifth width W5 of an open area of the lower layer under the middle layer. A sixth width W6 of an open area of the upper layer may be greater than the fourth width W4. In other words, the inner edge of the middle layer may extend further toward the central axis of the second groove 420 than the inner edges of the lower and upper layers.

When the intermediate layer 220 and the opposite electrode 230 are formed on the substrate 100 having the second groove 420 as shown in FIG. 6A, at least one of the intermediate layer 220 or the opposite electrode 230 may be disconnected around the second groove 420. In this regard, FIG. 6B illustrates that the intermediate layer 220 and the opposite electrode 230 are disconnected by the second groove 420. The second groove 420 entirely surrounds the opening OP in the first non-display area NDA1, as shown in FIG. 7. Therefore, the disconnection areas of the intermediate layer 220 and the opposite electrode 230 may also have a ring shape surrounding the opening OP.

Because the first inorganic encapsulation layer 310 has relatively excellent step coverage as described above, the first inorganic encapsulation layer 310 may be continuously formed without disconnection to cover the entire inner surface of the second groove 420, as shown in FIG. 6B.

When a plurality of second grooves 420 are located as shown in FIG. 6B, the organic encapsulation layer 320 may be located in any one of the second grooves 420. However, the organic encapsulation layer 320 is not located in at least one second groove 420 adjacent to the opening OP from among the plurality of second grooves 420. The organic encapsulation layer 320 is disconnected around at least one second groove 420 adjacent to the opening OP, as shown in FIGS. 4 and 8. For example, the organic encapsulation layer 320 may include an inner portion and an outer portion spaced apart from each other along the second groove 420, and the inner portion may have a ring shape surrounding the opening OP. Even if a foreign material such as moisture penetrates through the organic encapsulation layer 320 in a lateral direction from the opening OP toward the display area DA, the foreign material may be prevented from reaching the organic light-emitting diode of the display area DA because the organic encapsulation layer 320 is disconnected.

Although the first groove 410 described with reference to FIGS. 5A and 5B has been mainly described as being arranged in the third area A3, the embodiment of the present disclosure is not limited thereto. As shown in FIG. 4, the first groove 410 may also be located in the first area A1. Therefore, also in the first area A1, at least portions of the intermediate layer 220 and the opposite electrode 230 may be removed around the first groove 410, and the thin film encapsulation layer 300 may be minimized from being peeled off as a portion of the thin film encapsulation layer 300 is located in the first groove 410.

Figure 9:
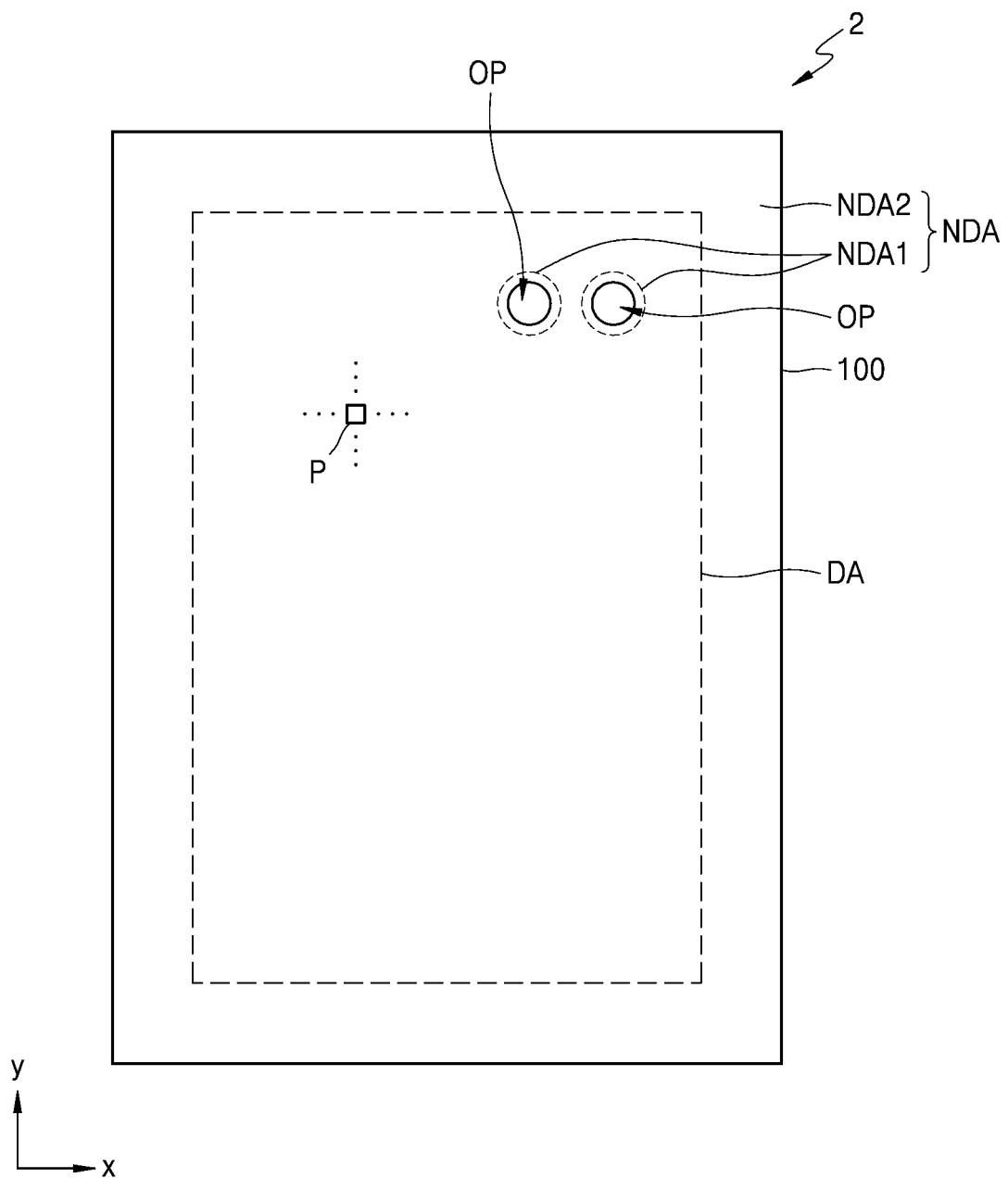
FIG. 9 is a schematic plan view illustrating a display device according to another embodiment of the present disclosure.

FIG. 9 is a schematic plan view illustrating a display device 2 according to another embodiment of the present disclosure.

Referring to FIG. 9, the display device 2 may include a plurality of openings OP. The openings OP may be located in a display area DA. A first non-display area NDA1 is arranged between the openings OP and the display area DA, and the first non-display area NDA1 may surround the openings OP. The display area DA may be surrounded by a second non-display area NDA2. Because a structure centered on each opening OP is the same as described above with reference to FIGS. 2 to 8, a repeated description hereof is omitted.

Figure 10:
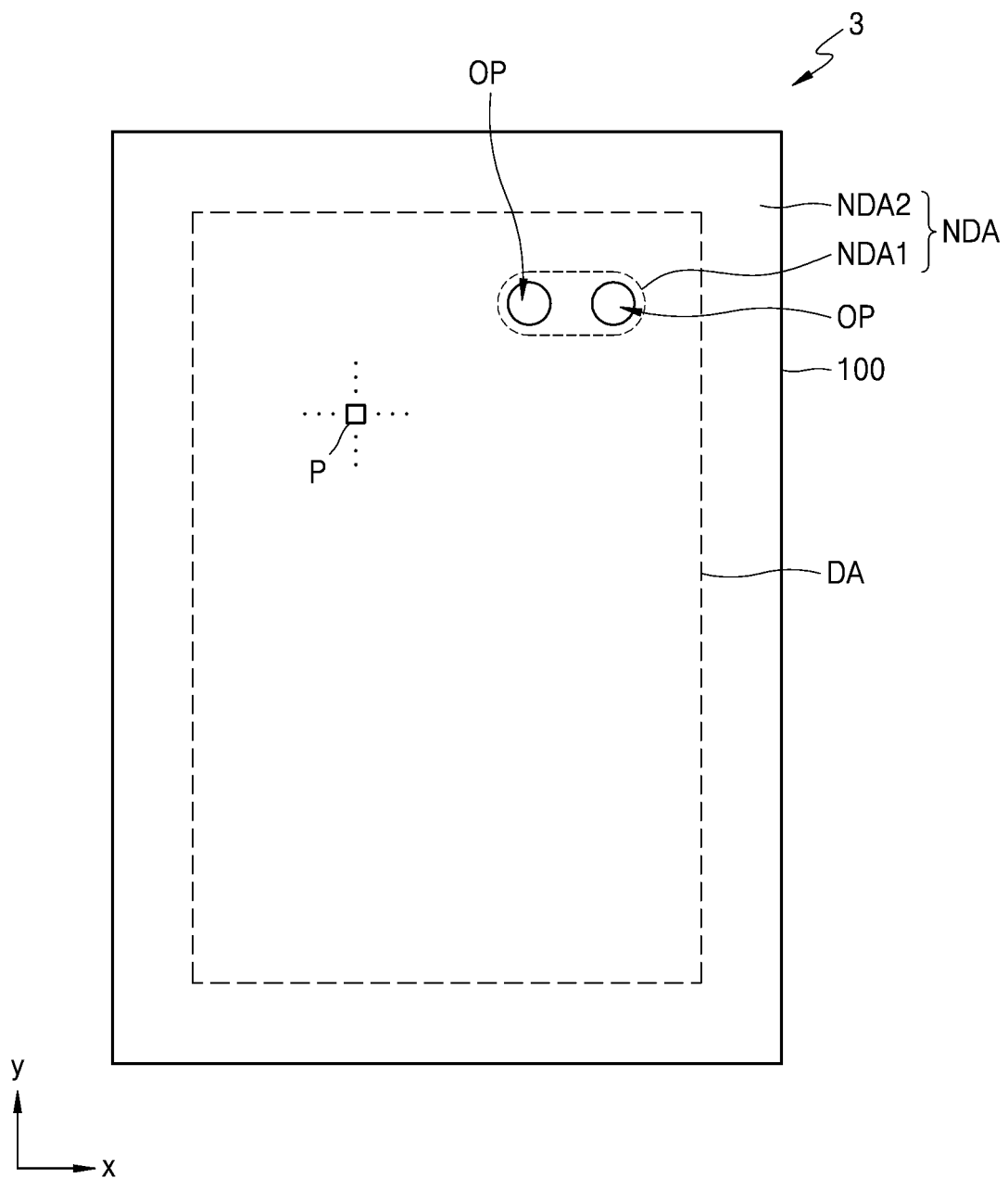
FIG. 10 is a schematic plan view illustrating a display device according to another embodiment of the present disclosure.
Figure 11:
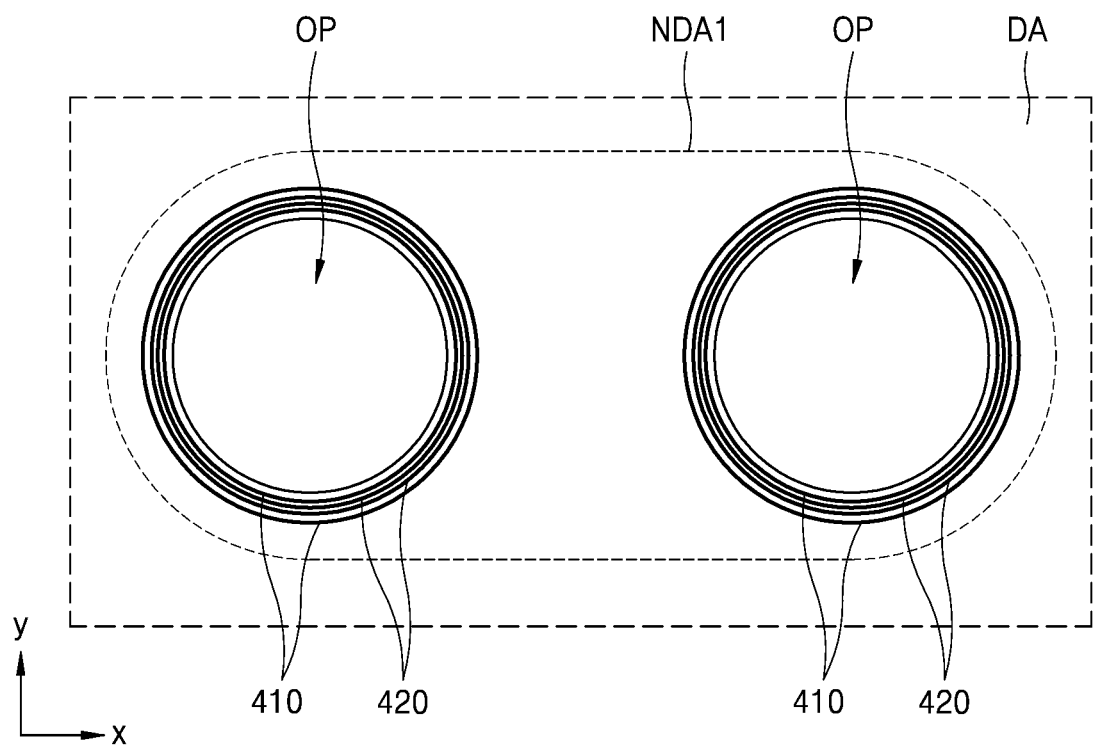
FIG. 11 is a plan view illustrating the first and second grooves around an opening in a display device according to another embodiment of the present disclosure.
Figure 11:
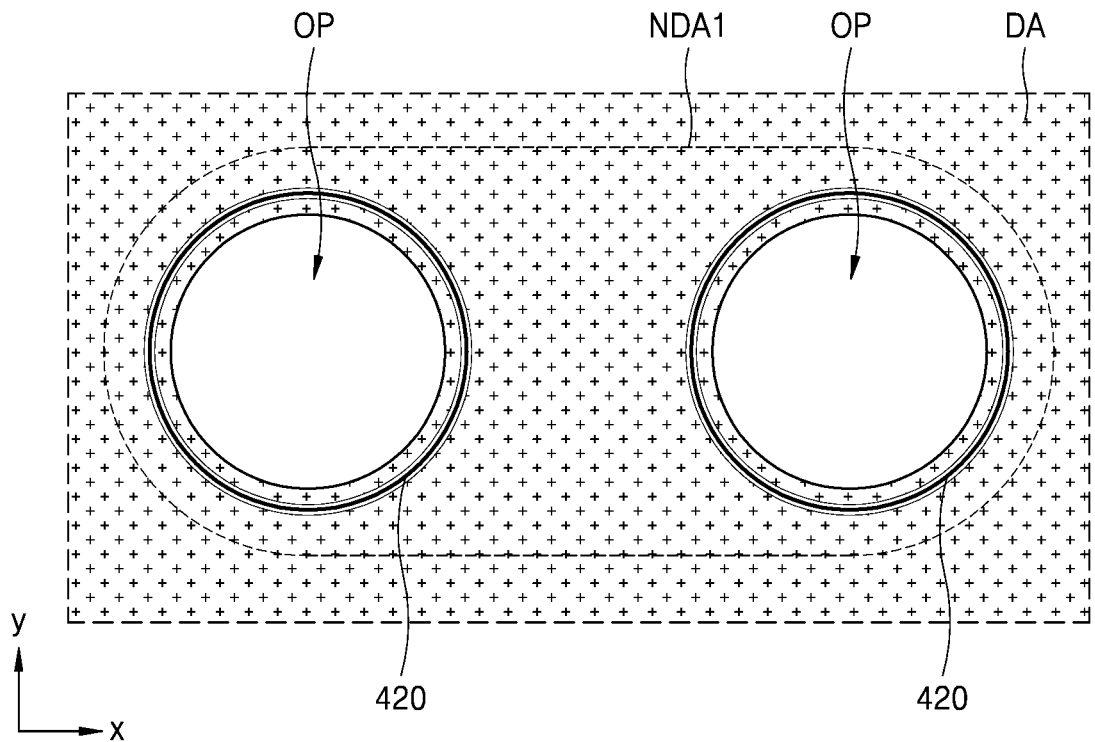

FIG. 10 is a schematic plan view illustrating a display device 3 according to another embodiment of the present disclosure, FIG. 11 is a plan view illustrating a groove around an opening in a display device according to another embodiment of the present disclosure, and FIG. 12 is a plan view illustrating an organic encapsulation layer around an opening in a display device according to another embodiment of the present disclosure.

Referring to FIG. 10, the display device 3 may include a plurality of openings OP. The openings OP may be located in a display area DA. A first non-display area NDA1 is arranged between the openings OP and the display area DA, and the first non-display area NDA1 may entirely surround the plurality of openings OP. The display area DA may be surrounded by a second non-display area NDA2.

As shown in FIG. 11, each of the plurality of openings OP arranged in the first non-display area NDA1 may be surrounded by first and second grooves 410 and 420, and the cross-sectional structures of the first and second grooves 410 and 420 are as described above with reference to FIGS. 4 to 6B.

As described above, a thin film encapsulation layer (i.e., the thin film encapsulation layer 300 in FIG. 4) covers not only the display area DA, but also the first non-display area NDA1. However, an organic encapsulation layer (i.e., the organic encapsulation layer 320 in FIG. 4) may provide a penetration path for moisture, and thus may be discontinuously formed around the openings OP. Referring to FIG. 12, the organic encapsulation layer 320 may be disconnected around the second groove 420 surrounding each of the plurality of openings OP arranged in the first non-display area NDA1. The organic encapsulation layer 320 may include an inner portion and an outer portion that are disconnected around the second groove 420, and the inner portion of the organic encapsulation layer 320 may have a ring shape surrounding each of the openings OP. The outer portion of the organic encapsulation layer 320 is spaced apart from the inner portion by a certain interval and may cover the display area DA and an area between adjacent openings OP in the first non-display area NDA1.

Although FIGS. 1 to 12 illustrate a case where the openings OP are circular, the present disclosure is not limited thereto. The opening OP may have various shapes such as a polygon, such as a square, or an oval, and the number of openings OP may be variously changed.

Although FIGS. 1 to 12 illustrate a case where the first non-display area NDA1 surrounding the opening OP is rounded along the shape of the opening OP, the present disclosure is not limited thereto. The first non-display area NDA1 may have various shapes such as a polygon, such as a square, or an oval, and the shape of the first non-display area NDA1 is not limited.

Although FIGS. 1 to 12 illustrate a case where the display area DA is approximately square, the present disclosure is not limited thereto. The display area DA may have various shapes such as a polygon, such as a triangle or a pentagon, a circle or an oval. It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

The invention claimed is:

1. A display device comprising:
    a substrate defining an opening and comprising a display area and a non-display area between the opening and the display area;
    a pixel array comprising a plurality of pixels in the display area, each of the plurality of pixels including a pixel electrode, an opposite electrode facing the pixel electrode, and an intermediate layer between the pixel electrode and the opposite electrode;
    a plurality of data lines bypassing the opening in the non-display area;
    a first insulating layer and a second insulating layer, which cover the plurality of data lines;
    a conductive layer between the first insulating layer and the second insulating layer; and
    a thin film encapsulation layer covering the pixel array, the thin film encapsulation layer including at least one organic encapsulation layer and at least one inorganic encapsulation layer,
    wherein, in the non-display area, a first groove is defined by the first insulating layer, the conductive layer, and the second insulating layer,
    wherein, in a cross-sectional view, top, bottom and end surfaces of the conductive layer extend further toward a central axis of the first groove relative to adjacent surfaces of the first insulating layer and the second insulating layer defining the first groove; and
    wherein at least one sublayer of the intermediate layer extends toward the opening and comprises a first portion and a second portion which are separated from each other, the first portion being around the first groove and the second portion being in the first groove.

2. The display device of claim 1, wherein the first groove overlaps the plurality of data lines.

3. The display device of claim 1, wherein a width of the first groove at the conductive layer is less than a width of the first groove at the first insulating layer.

4. The display device of claim 1, wherein the opposite electrode extends toward the opening and comprises a first portion and a second portion which are separated from each other, the first portion being around the first groove and the second portion being in the first groove.

5. The display device of claim 1, wherein a portion of the at least one organic encapsulation layer is in the first groove.

6. The display device of claim 1, wherein the at least one inorganic encapsulation layer entirely covers an inner surface of the first groove.

7. The display device of claim 1, wherein the first groove surrounds the opening.

8. The display device of claim 1, further comprising:
    a multi-insulating layer arranged on the substrate and under the first insulating layer; and
    a second groove defined by the multi-insulating layer and the substrate.

9. The display device of claim 8, wherein the second groove is between the opening and the first groove, and surrounds the opening.

10. The display device of claim 8, wherein the at least one organic encapsulation layer extends toward the opening and is disconnected around the second groove.

11. The display device of claim 1, wherein the second insulating layer covers an edge of the pixel electrode.

12. The display device of claim 1, wherein the first groove has an anchor shape in the cross-sectional view.

13. A display device comprising:
    a substrate defining an opening;
    a pixel array comprising a plurality of pixels on the substrate and surrounding the opening, each of the plurality of pixels comprising a display element comprising a pixel electrode, an intermediate layer on the pixel electrode, and an opposite electrode on the intermediate layer;
a plurality of data lines between the opening and the pixel array, the plurality of data lines bypassing the opening along an edge of the opening;
a multi-layer on the plurality of data lines, the multi-layer defining a first groove;
a multi-insulating layer between the substrate and the multi-layer, the multi-insulating layer defining a second groove extending through the multi-insulating layer and through a portion of the substrate; and
wherein at least one sublayer of the intermediate layer comprises a first portion and a second portion which are separated from each other, the first portion being around the first groove and the second portion being in the first groove.

14. The display device of claim 13, wherein the opposite electrode comprises a first portion and a second portion which are separated from each other, the first portion being around the first groove and the second portion being in the first groove.

15. The display device of claim 13, wherein the multi-layer comprises:

a first layer defining a first open area;
a second layer under the first layer, the second layer defining a second open area; and
a third layer on the first layer, the third layer defining a third open area,
wherein a width of the first open area is less than a width of the second open area.

16. The display device of claim 15, wherein the first layer comprises a same material as the pixel electrode, and
the second layer and the third layer comprise an insulating material.

17. The display device of claim 14, further comprising a thin film encapsulation layer covering the pixel array, the thin film encapsulation layer comprising at least one organic encapsulation layer and at least one inorganic encapsulation layer.

18. The display device of claim 17, wherein a portion of the at least one organic encapsulation layer is in the first groove.

19. The display device of claim 17, wherein the at least one organic encapsulation layer extends toward the opening and is disconnected in an area between the opening and the first groove.

20. The display device of claim 13, wherein the second groove is between the opening and the first groove and surrounds the opening.

* * * * *